United States Patent [19]

Yamamoto et al.

[11] Patent Number: 4,819,244
[45] Date of Patent: Apr. 4, 1989

[54] SEMICONDUCTOR LASER DEVICE

[75] Inventors: Saburo Yamamoto, Nara; Hiroshi Hayashi, Kyoto; Taiji Morimoto, Nara, all of Japan

[73] Assignee: Sharp Kabushiki Kaisha, Osaka, Japan

[21] Appl. No.: 870,450

[22] Filed: Jun. 4, 1986

[30] Foreign Application Priority Data

Jun. 11, 1985 [JP] Japan .................. 60-128664

[51] Int. Cl.⁴ ................. H01S 3/19
[52] U.S. Cl. ................. 372/46; 372/45; 357/17
[58] Field of Search ......... 372/46, 45; 357/17

[56] References Cited

U.S. PATENT DOCUMENTS 4,592,062  5/1986  Yamamoto et al. ........... 357/17

FOREIGN PATENT DOCUMENTS 10095895  7/1983  European Pat. Off. .
0205338  12/1986  European Pat. Off. ........... 372/43
0085584  5/1983  Japan ........................... 372/46
0148481  9/1983  Japan ........................... 372/43

OTHER PUBLICATIONS

Applied Physics Letter, vol. 41, No. 9, Nov. 1, 1982, pp. 796-798, American Inst. of Physics, New York, US; S. Yamamoto et al.
IEEE Journal of Quantum Electronics, vol. QE-19, No. 6, Jun. 1983, pp. 1009-1015, IEEE, New York, US; S. Yamamoto et al.
IEEE Journal of Quantum Electronics, vol. QE-21, No. 3, Mar. 1985, pp. 271-277, IEEE, New York, US; J.-M. Liu et al.
Patent Abstracts of Japan, vol. 8, No. 200, (E-266), (1637), Sep. 13, 1984; & JP-A-59 87 889, (Fujitsu K.K.) 05-21-1984.
Patent Abstracts of Japan, vol. 5, No. 167, (E-79), (839), Oct. 24, 1981; & JP-A-56 96 890, (Fujitsu K.K.) 08-0-5-1981.

Primary Examiner—William L. Sikes
Assistant Examiner—Xuan T. Vo
Attorney, Agent, or Firm—Ciotti & Murashige, Irell & Manella

[57] ABSTRACT

A V-channel inner stripe semiconductor laser device comprising a multi-layered growth crystal having an active layer for laser oscillation but no substrate, with a buffer layer formed on the multi-layered growth crystal thicker than all of the layers of the growth crystal, where the multi-layered growth crystal and buffer layer are sandwiched between an n-sided electrode and a p-sided electrode, wherein a pair of mesa-striped channels are formed outside of the V-channel to remove the outside of the optical waveguide formed in the active layer corresponding to the V-channel.

1 Claim, 2 Drawing Sheets

SEMICONDUCTOR LASER DEVICE

BACKGROUND OF THE INVENTION

1. Field of the invention

This invention relates to a semiconductor laser device. More particularly, it relates to a novel structure of semiconductor laser devices which can be used for a laser light source in such fields as optical information processors (e.g., video discs, audio-discs, laser printers, etc.) and/or optical communication systems.

2. Description of the prior art:

Semiconductor laser devices to be used as a light source for optical information processors must have the characteristics that light, with as short a wavelength as possible, can be lased, laser oscillation in a stable transverse mode can be achieved, the threshold current is at a low level, device operation can be carried out for long periods of time, etc. As semiconductor lasers having such characteristics, V-channeled substrate inner stripe (VSIS) lasers are known, an example of which is shown in FIG. 2. On a p-GaAs substrate 1, an n-GaAs current blocking layer 2, a p-GaAlAs cladding layer 3, a GaAlAs active layer 4, an n-GaAlAs cladding layer 5, and an n-GaAs cap layer 6 are successively formed. An n-sided electrode 7 and a p-sided electrode 8 are formed on the upper face of the cap layer 6 and the back face of the substrate 1, respectively. In this semiconductor laser device, current injected thereinto flows through the striped region alone within the V-channel 9 and light outside of the V-channel 9 is absorbed by the current blocking layer 2, so that oscillation in a stable transverse mode at a low threshold current can be easily attained. However, when a laser light-emitting apparatus which can oscillate at a short wavelength of 740 nm or less is produced using the above-mentioned VSIS laser device having such excellent characteristics, there are problems in that distortion (i.e., compressive stress) arises in the active layer 4 and the generation of heat arises in the oscillation region, which significantly shorten the operation life thereof.

The lattice constant of the thick GaAs substrate 1 supporting the epitaxial growth layers thereon completely matches that of each of the GaAlAs growth layers at a growth temperature in the range of about 800° C. to about 900° C., but the thermal expansion coefficient of each is different, so that a difference in the lattice constant therebetween arises at room temperatures, resulting in a compressive stress in the active layer 4. For example, when the active layer is composed of a crystal of $Ga_{0.7}Al_{0.3}As$, it receives compressive stress of as high as about $3 \times 10^8$ dyn/cm$^2$.

Moreover, the oscillation threshold current Ith is rapidly increased at a wavelength of 740 nm or less, and the Ith at 700 nm or less becomes twice as high as that at 740 nm or more.

In fact, about one half of the Ith of a VSIS semiconductor laser leaks from the optical waveguide and becomes ineffective current which does not contribute to laser oscillation. As mentioned above, Ith is increased at a short wavelength, which causes a considerable generation of heat in the oscillation area. If such a distortion in the active layer and such heat generation in the oscillation area can be reduced, the life of the device will be noticeably improved.

SUMMARY OF THE INVENTION

The semiconductor laser device of this invention, which overcomes the above-discussed and numerous other disadvantages and deficiencies of the prior art, comprises a multi-layered growth crystal having an active layer therein for laser oscillation, but having no substrate; a buffer layer formed on said multi-layered growth crystal, the thickness of said buffer layer being thicker than that of all layers constituting said multi-layered growth crystal; and a p-sided electrode and an n-sided electrode sandwiching therebetween the composite of said multi-layered growth crystal and said buffer layer.

The semiconductor laser device is, in a preferred embodiment, a substrate-free semiconductor laser device utilizing the structure of a VSIS laser.

A pair of mesa-striped channels are, in a preferred embodiment, formed outside of the V-channel to remove the outside of the optical waveguide formed in said active layer corresponding to said V-channel.

Thus, the invention described herein makes possible the objects of (1) providing a semiconductor laser device in which distortion arising in the active layer and ineffective current are reduced and also lowering of the threshold current is attained, so that the generation of heat in the oscillation area can be suppressed, which allows the improvement of the operation life of the laser device; and (2) a process for the production of a semiconductor laser device which comprises growing a double-heterostructure multi-layered crystal for laser oscillation on a substrate, growing a buffer layer with a thickness of, for example, about 100 μm on the said double-heterostructure multi-layered crystal, removing the substrate causing distortion in the active layer by means of an etching technique, and removing portions of the active layer outside of the V-channel by means of a mesa-etching technique.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
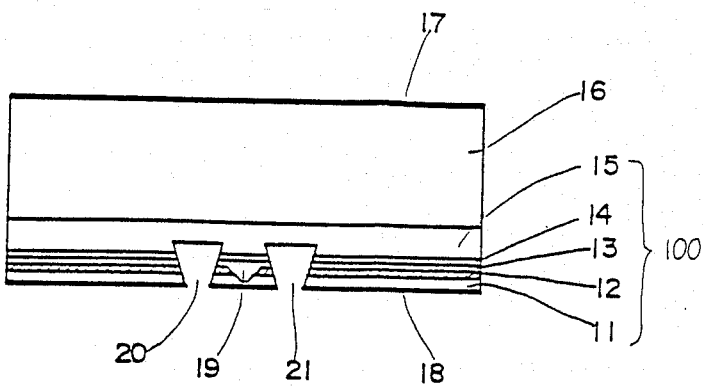
FIG. 1 is a front sectional view showing a semiconductor laser device of this invention.
Figure 2:
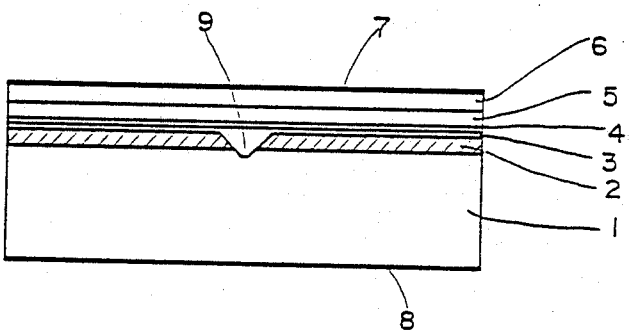
FIG. 2 is a front sectional view showing a conventional VSIS laser device.

FIG. 1 shows a substrate-free semiconductor laser device of this invention utilizing the structure of a VSIS laser, which comprises a double-heterostructure multi-layered crystal 100 for laser oscillation and an n-GaAlAs buffer layer 16. The double-heterostructure multi-layered crystal 100 successively comprises a p-GaAs layer 11, an n-GaAs current blocking layer 12 at the center of which a V-striped channel 19 is formed in a manner to reach the p-GaAs layer 11 resulting in a current path within which current is confined, a p-GaAlAs cladding layer 13, a GaAlAs active layer 14, and an n-GaAlAs cladding layer 15. The multi-layered crystal from the p-GaAs layer 11 to the buffer layer 16 is composed of epitaxial growth layers. The thickness of the buffer layer 16 is considerably thicker than that of other growth layers. An n-sided electrode 17 and a p-sided electrode 18 are disposed on the upper face of the buffer layer 16 and the back face of the p-GaAs layer 11, respectively. A pair of reverse mesa-striped channels 20 and 21 are formed outside the V-striped channel 19 from the back face of the p-GaAs layer 11 to the inside of the n-cladding layer 15, such that the outside of the optical waveguide formed in the active layer 14 corresponding to the V-striped channel 19 can be removed. These channels 20 and 21 function to reduce the residual compressive stress applied to the active layer 14 and to prevent carriers, which have been injected into the active layer 14 positioned above the V-channel 19, from diffusing into the outside of the V-channel 19. It has been found that the prevention of carriers from transversely diffusing allows the threshold current Ith to be reduced to about one half. Therefore, although the Ith of a conventional semiconductor laser device having an oscillation wavelength of 700 nm is about two times as high as that of a semiconductor laser device having an oscillation wavelength of 740 nm, the Ith of the above-mentioned semiconductor laser device of this invention having an oscillation wavelength of 700 nm is the same as that of a semiconductor laser device having an oscillation wavelength of 740 nm.

Figure 3A:
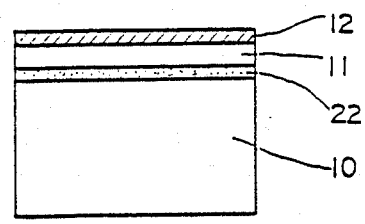
FIGS. 3(A) to 3(E) are diagrams showing a production process of the semiconductor laser device shown in FIG. 1.

FIGS. 3(A) to 3(E) show a production process of the above-mentioned semiconductor laser device of this invention shown in FIG. 1. As shown in FIG. 3(A), on the (100) face of a substrate 10, a $Ga_{0.5}Al_{0.5}As$ etching preventive layer 22 having a thickness of about 1 $\mu m$ is grown. Then, on the etching preventive layer 22, a p-GaAs layer 11 having a thickness of 1.5 $\mu m$ and a current blocking layer 12 having a thickness of 0.6 $\mu m$ are formed. Since the GaAs substrate 10 and the etching preventive layer 22 are finally removed, their polarity is less important so that a p-type, an n-type or an undoped-type can be adapted thereto, but it is desirable that the GaAs substrate 10 has a low transition density.

Figure 3B:
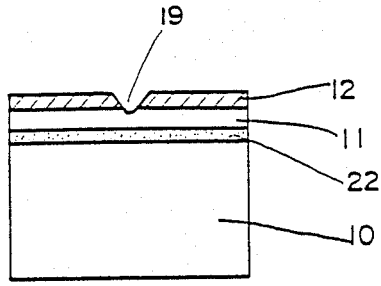
Figure 3C:
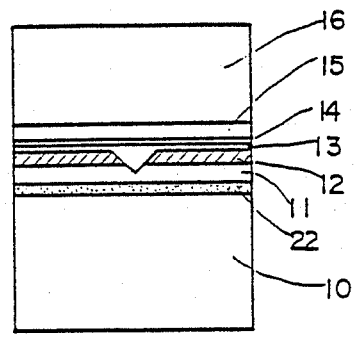
Figure 3D:
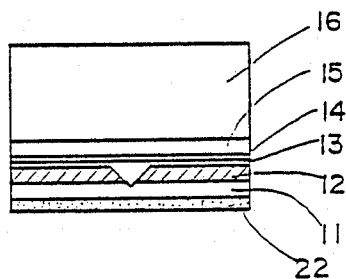

Then, as shown in FIG. 3(B), a V-striped channel 19 is formed in the (110) direction from the surface of the current blocking layer 12 to the inside of the GaAs layer 11 through the current blocking layer 12. The V-channel 19 functions as a current path through which injected current flows. Then, as shown in FIG. 3(C), on the current blocking layer 12 including the V-channel 19, a p-$Ga_{0.2}Al_{0.8}As$ cladding layer 13, a p-$Ga_{0.7}Al_{0.3}As$ active layer 14, an n-$Ga_{0.2}Al_{0.8}As$ cladding layer 15, and an n-$Ga_{0.85}Al_{0.15}As$ buffer layer 16, which have a thickness of 0.15 $\mu m$, 0.1 $\mu m$, 1.0 $\mu m$, and 80 $\mu m$, respectively, are formed by liquid phase epitaxy, followed by etching using an etchant containing $H_2O_2$ and $NH_4OH$ ($H_2O_2$ :$NH_4OH$ = 20:1) to completely remove the GaAs substrate 11 as shown in FIG. 3(D). This etchant reacts with the GaAlAs layer to form an oxide film which prevents the etchant from etching the GaAlAs layer, and thus further etching does not proceed due to the $Ga_{0.5}Al_{0.5}As$ non-etchable layer 22.

Figure 3E:
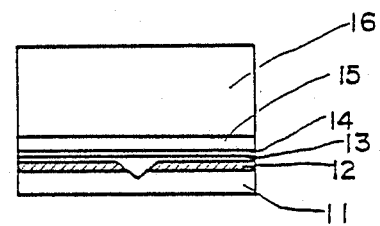

As shown in FIG. 3(E), the non-etchable layer 22 is then completely removed using hydrofluoric acid, and, as shown in FIG. 1, the n-sided electrode 17 and the p-sided electrode 18 are formed. Then, using photolithography and a chemical etching technique, the mesa-etched channels 20 and 21 are formed to eliminate both sides of the portion of the active layer 14 corresponding to the V-channel 19. Since these channels 20 and 21 are positioned in the (110) direction, they form a reverse mesa-shape while the V-channel 19 forms a normal mesa-shape. The resulting wafer is cleaved to form chips of a semiconductor laser device having Fabry-Pérot facets, each of which is then mounted on a copper board using In as a solder in such a manner that the p-GaAs layer 11 is placed at a lower portion.

The resulting substrate-free semiconductor laser device continuously attained oscillation at a short wavelength of 670 nm at room temperatures. The threshold current was 50 mA. In this semiconductor laser device, distortion to be applied to the active layer 14 was reduced and heat generation was also reduced due to a decrease in the threshold current. Therefore, according to this invention, notwithstanding the oscillation wavelength of shorter than 740 nm, a highly reliable semiconductor laser device can be obtained. Moreover, stabilized oscillation in a transverse mode can be attained providing a semiconductor laser device which is most useful as a light source for optical information systems.

This invention is, of course, applicable not only to GaAlAs laser devices, but also to ternary- or quaternary- compound semiconductor laser devices using crystal materials such as InP, GaP, GaAsP, InAs, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device having a multi-layered growth crystal having an active layer therein for laser oscillation, but having no substrate; a buffer layer formed on said multi-layered growth crystal, the thickness of said buffer layer being thicker than that of all layers constituting said multi-layered growth crystal; a p-sided electrode and an n-sided electrode sandwiching therebetween the composite of said multi-layered growth crystal and said buffer layer, and having the structure of a V-channeled substrate inner stripe laser, the device wherein:

a pair of mesa-striped channels are formed outside of the V-channel to remove the outside of the optical waveguide formed in said active layer corresponding to said V-channel.

* * * * *